United States Patent
Leem et al.

(10) Patent No.: US 8,933,438 B2
(45) Date of Patent: Jan. 13, 2015

(54) PHOTODIODE

(75) Inventors: Dong-Seok Leem, Hwaseong-si (KR); Kyu Sik Kim, Jeonju-si (KR); Kyung Bae Park, Seoul (KR); Kwang Hee Lee, Suwon-si (KR); Seon-Jeong Lim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/461,250

(22) Filed: May 1, 2012

(65) Prior Publication Data

US 2013/0105768 A1    May 2, 2013

(30) Foreign Application Priority Data

Oct. 31, 2011  (KR) .......................... 10-2011-0112341

(51) Int. Cl.
- *H01L 51/50* (2006.01)
- *H01L 27/32* (2006.01)
- *H01L 51/56* (2006.01)
- *H01L 51/42* (2006.01)

(52) U.S. Cl.
CPC ........ *H01L 51/4246* (2013.01); *H01L 51/4273* (2013.01); *Y02E 10/549* (2013.01)
USPC ................... 257/40; 257/88; 257/79; 438/28; 438/29; 438/99

(58) Field of Classification Search
CPC ............................... H01L 51/50; H01L 27/32
USPC ................ 257/40, 79, 88; 438/99, 28, 29
See application file for complete search history.

(56) References Cited

U.S. PATENT DOCUMENTS

| | | | |
|---|---|---|---|
| 6,013,538 A * | 1/2000 | Burrows et al. | 438/22 |
| 7,859,186 B2 | 12/2010 | Noh et al. | |
| 2008/0035965 A1* | 2/2008 | Hayashi et al. | 257/291 |
| 2008/0297036 A1 | 12/2008 | Noh et al. | |
| 2009/0090903 A1* | 4/2009 | Kim et al. | 257/40 |
| 2009/0184235 A1* | 7/2009 | Nomura et al. | 250/206 |
| 2010/0019236 A1* | 1/2010 | Okinaka et al. | 257/40 |
| 2010/0264407 A1 | 10/2010 | Murata et al. | |
| 2011/0006294 A1* | 1/2011 | Tanaka et al. | 257/40 |
| 2011/0012091 A1 | 1/2011 | Forrest et al. | |
| 2011/0020979 A1* | 1/2011 | Forrest et al. | 438/94 |

(Continued)

FOREIGN PATENT DOCUMENTS

| | | |
|---|---|---|
| JP | 2010-123716 A | 6/2010 |
| KR | 2008-0105640 A | 12/2008 |
| KR | 2010-0094472 A | 8/2010 |

OTHER PUBLICATIONS

Yokoyama, M. et al., "Highly Efficient White Organic Light-Emitting Diodes with a p-i-n Tandem Structure", Japanese Journal of Applied Physics 50, Apr. 20, 2011.

(Continued)

*Primary Examiner* — Ha Tran T Nguyen
*Assistant Examiner* — Thai T Vuong
(74) *Attorney, Agent, or Firm* — Harness, Dickey & Pierce, P.L.C.

(57) ABSTRACT

A photodiode may include an anode, a cathode, a photoelectric conversion layer between the anode and the cathode, and a buffer layer between the photoelectric conversion layer and the anode. The buffer layer may have a dual-layered structure including an organic layer and an inorganic layer.

11 Claims, 11 Drawing Sheets

(56) References Cited

U.S. PATENT DOCUMENTS

| | | | |
|---|---|---|---|
| 2011/0049492 A1* | 3/2011 | Sawaki et al. | 257/40 |
| 2011/0049504 A1* | 3/2011 | Kato | 257/40 |
| 2011/0068254 A1* | 3/2011 | Hayashi | 250/208.1 |
| 2011/0233701 A1* | 9/2011 | Mitsui et al. | 257/431 |
| 2012/0012183 A1* | 1/2012 | Luo et al. | 136/263 |

OTHER PUBLICATIONS

Lee, J-H. et al., "Effectiveness of p-dopants in an organic hole transporting material", Appl. Phys. Lett. 94, Mar. 27, 2009.

* cited by examiner

PHOTODIODE

CROSS REFERENCE TO RELATED APPLICATIONS

This application claims priority to and the benefit of Korean Patent Application No. 10-2011-0112341 filed in the Korean Intellectual Property Office on Oct. 31, 2011, the entire contents of which are incorporated herein by reference.

BACKGROUND

1. Field

Example embodiments relate to a photodiode.

2. Description of the Related Art

An organic photodiode is used in smaller photoelectric applications instead of a silicon photodiode because the organic photodiode includes organic materials that have a higher absorption coefficient and selective wavelength absorption. Thus, the size of the organic photodiode may be more easily reduced.

However, the organic photodiode may have external quantum efficiency for visible light lower than the silicon photodiode and may have higher dark current due to impurity in the organic materials. The increase of the dark current may cause higher current leakage, and the higher current leakage may decrease sensitivity of the photodiode and the accuracy of the external quantum efficiency that can be calculated from the photo current during light reaction.

A buffer layer may be added between an anode and a photoelectric layer of the photodiode in order to reduce the dark current of the organic photodiode. However, the degree of the dark current reduction may not be sufficient.

SUMMARY

Example embodiments provide a photodiode.

According to example embodiments, a photodiode may include an anode; a cathode; a photoelectric conversion layer disposed between the anode and the cathode; and a buffer layer disposed between the photoelectric conversion layer and the anode and having a dual-layered structure including an organic layer and an inorganic layer.

The organic layer may be closer to the anode than the inorganic layer. The organic layer may include at least one of 4,4',4''-tris(N-(2-naphthyl)-N-phenyl-amino)-triphenylamine ("2TNATA"), 4,4',4''-tris(N-3-methylphenyl-N-phenylamino)triphenylamine ("m-MTDATA"), and N,N,N',N'-tetrakis(4-methoxyphenyl)-benzidine ("MeO-TPD").

The inorganic layer may include at least one of $MoO_x$, $V_xO_y$, $WO_x$, $ReO_x$, $Re_xO_y$, and CuI. The organic layer may include 2TNATA, and the inorganic layer may include MoOx. Each of the organic layer and the inorganic layer may have a thickness of about 1 nm to about 100 nm. The photoelectric conversion layer may include an intrinsic layer including a P-type semiconductor and an N-type semiconductor.

The photoelectric conversion layer may further include a P-type layer disposed between the intrinsic layer and the buffer layer and including a P-type semiconductor but substantially not an N-type semiconductor, and the P-type semiconductor may include at least one of N,N'-dimethyl-quinacridone ("NNQA"), diindenoperylene, and dibenzo{[f,f']-4,4',7,7'-tetraphenyl}diindeno[1,2,3-cd:1',2',3'-lm]perylene.

The photoelectric conversion layer may further include an N-type layer disposed between the intrinsic layer and the cathode and including an N-type semiconductor but substantially not a P-type semiconductor, and the N-type semiconductor may include at least one of dicyanovinyl-terthiophene ("DCV3T"), C60, and perylene diimide.

The photoelectric conversion layer may further include an N-type layer disposed between the intrinsic layer and the cathode and including an N-type semiconductor but substantially not a P-type semiconductor, the P-type semiconductor may include at least one of N,N'-dimethyl-quinacridone ("NNQA"), diindenoperylene, and dibenzo{[f,f']-4,4',7,7'-tetraphenyl}diindeno[1,2,3-cd:1',2',3'-lm]perylene, and the N-type semiconductor may include at least one of dicyanovinyl-terthiophene ("DCV3T"), C60, and perylene diimide.

The photodiode may further include a hole blocking layer disposed between the photoelectric conversion layer and the cathode. The hole blocking layer may include at least one of 4,7-diphenyl-1,10-phenanthroline ("Bphen"), 2,9-dimethyl-4,7-diphenyl-1,10-phenanthroline ("BCP"), 2,2',2''-(1,3,5-benzinetriyl)-tris(1-phenyl-1-Hbenzimidazole) ("TPBi"), 1,3-bis[2-(2,2'-bipyridine-6-yl)-1,3,4-oxadiazo-5-yl]benzene ("Bpy-OXD"), 2,7-bis[2-(2,2'-bipyridine-6-yl)-1,3,4-oxadiazo-5-yl]-9,9-dimethylfluorene ("Bpy-FOXD"), bis-4,6-(3,5-di-3-pyridylphenyl)-2-methylpyrimidine (B3PYMPM), Tris(2,4,6-trimethyl-3-(pyridin-3-yl)phenyl)borane ("3TPYMB"), 3,3',5,5'-tetra[(m-pyridyl)-phen-3-yl]biphenyl ("BP4MPY"), and 1,3-bis[3,5-di(pyridin-3-yl)phenyl]benzene (BmPyPhB).

According to example embodiments, a photodiode may include an anode; a cathode; a photoelectric conversion layer disposed between the anode and the cathode; and a buffer layer disposed between the photoelectric conversion layer and the anode and including at least one of 4,4',4''-Tris(N-(2-naphthyl)-N-phenyl-amino)-triphenylamine ("2TNATA"), 4,4',4''-Tris(N-3-methylphenyl-N-phenylamino)triphenylamine ("m-MTDATA"), and N,N,N',N'-Tetrakis(4-methoxyphenyl)-benzidine ("MeO-TPD").

The buffer layer may include 2TNATA. The buffer layer may have a thickness of about 1 nm to about 100 nm. The photoelectric conversion layer may include an intrinsic layer including a P-type semiconductor and an N-type semiconductor, the P-type semiconductor may include at least one of N,N'-dimethyl-quinacridone ("NNQA"), diindenoperylene, and dibenzo{[f,f']-4,4',7,7'-tetraphenyl}diindeno[1,2,3-cd:1',2',3'-lm]perylene, and the N-type semiconductor may include at least one of dicyanovinyl-terthiophene ("DCV3T"), C60, and perylene diimide.

The photoelectric conversion layer may further include at least one of a P-type layer and an N-type layer, the P-type layer including a P-type semiconductor but substantially not an N-type semiconductor and disposed between the intrinsic layer and the buffer layer, and the N-type layer including an N-type semiconductor but substantially not a P-type semiconductor and disposed between the intrinsic layer and the cathode.

The photodiode may further include a hole blocking layer between the photoelectric conversion layer and the cathode. The hole blocking layer may include at least one of 4,7-diphenyl-1,10-phenanthroline ("Bphen"), 2,9-dimethyl-4,7-diphenyl-1,10-phenanthroline ("BCP"), 2,2',2''-(1,3,5-benzinetriyl)-tris(1-phenyl-1-Hbenzimidazole) ("TPBi"), 1,3-bis[2-(2,2'-bipyridine-6-yl)-1,3,4-oxadiazo-5-yl]benzene ("Bpy-OXD"), 2,7-bis[2-(2,2'-bipyridine-6-yl)-1,3,4-oxadiazo-5-yl]-9,9-dimethylfluorene ("Bpy-FOXD"), bis-4,6-(3,5-di-3-pyridylphenyl)-2-methylpyrimidine (B3PYMPM), Tris(2,4,6-trimethyl-3-(pyridin-3-yl)phenyl)borane ("3TPYMB"), 3,3',5,5'-tetra[(m-pyridyl)-phen-3-yl]biphenyl ("BP4MPY"), and 1,3-bis[3,5-di(pyridin-3-yl)phenyl]benzene (BmPyPhB).

BRIEF DESCRIPTION OF THE DRAWINGS

These and/or other aspects will become apparent and more readily appreciated from the following description of example embodiments, taken in conjunction with the accompanying drawings in which.

DETAILED DESCRIPTION

Example embodiments will be described more fully hereinafter with reference to the accompanying drawings. As those skilled in the art would realize, the described embodiments may be modified in various different ways, all without departing from the spirit or scope. In the drawing, parts having no relationship with the explanation are omitted for clarity, and the same or similar reference numerals designate the same or similar elements throughout the specification.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1:
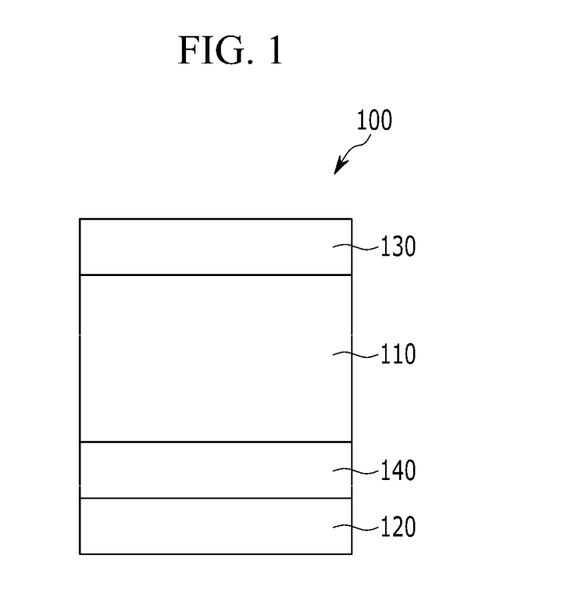
FIGS. 1 to 8 are schematic sectional views of photodiodes according to example embodiments.
Figure 2:
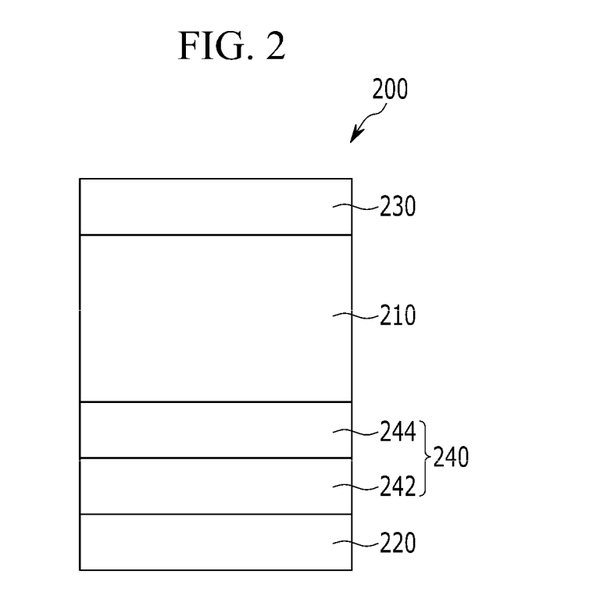

FIGS. 1 and 2 are schematic sectional views of photodiodes according to example embodiments. Referring to FIG. 1, a photodiode 100 according to example embodiments may include a photoelectric conversion layer 110, an anode 120 and a cathode 130 disposed on opposing sides of the photoelectric conversion layer 110, and a buffer layer 140 disposed between the anode 120 and the photoelectric conversion layer 110. Although FIG. 1 shows that the anode 120 is disposed under the photoelectric conversion layer 110 and the cathode 130 is disposed on the photoelectric conversion layer 110, the cathode 130 may be disposed under the photoelectric conversion layer 110 and the anode 120 may be disposed on the photoelectric conversion layer 110.

The photoelectric conversion layer 110 may generate light upon receiving light. According to example embodiments, the photoelectric conversion layer 110 may be an intrinsic layer that includes both a P-type semiconductor and an N-type semiconductor, and the photoelectric conversion layer 110 may be formed by, for example, co-deposition. According to example embodiments, the photoelectric conversion layer 110 may further include, in addition to an intrinsic layer, at least one of a P-type layer (not shown) disposed between the intrinsic layer and the anode 120 and an N-type layer (not shown) disposed between the intrinsic layer and the cathode 130. The P-type layer may include a P-type semiconductor but substantially not an N-type semiconductor, and the N-type layer may include an N-type semiconductor but substantially not a P-type semiconductor.

The P-type semiconductor may include, for example, at least one of N,N'-dimethyl-quinacridone ("NNQA"), diindenoperylene, and dibenzo{[f,f']-4,4',7,7'-tetraphenyl}diindeno[1,2,3-cd:1',2',3'-lm]perylene, and the N-type semiconductor may include, for example, at least one of dicyanovinyl-terthiophene ("DCV3T"), C60, and perylene diimide. However, other semiconductors also may be used for the P-type semiconductor and the N-type semiconductor.

The composition ratios of the P-type semiconductor and the N-type semiconductor may vary depending on their respective positions in the photoelectric conversion layer 110.

The anode 120 may include a transparent conductive material, e.g., indium-tin-oxide (ITO) and indium-zinc-oxide (IZO), so that light may pass through the anode 120, but the material for the anode 120 is not limited thereto. The cathode 130 may include a metal, for example, aluminum (Al), but the material for the cathode 130 is not limited thereto.

The anode 120 may be formed by, for example, sputtering, and the cathode 130 may be formed by, for example, thermal evaporation, but the deposition methods for the anode 120 and the cathode 130 are not limited thereto.

The buffer layer 140 may include at least one of 4,4',4"-tris(N-(2-naphthyl)-N-phenyl-amino)-triphenylamine ("2TNATA"), 4,4',4"-tris(N-3-methylphenyl-N-phenyl-amino)triphenylamine ("m-MTDATA"), and N,N,N',N'-tetrakis(4-methoxyphenyl)-benzidine ("MeO-TPD"). The buffer layer 140 may have a thickness of about 1 nm to about 100 nm. The introduction of the buffer layer 140 including 2TNATA, m-MTDATA, or MeO-TPD may reduce the dark current of the photodiode 100.

Referring to FIG. 2, a photodiode 200 according to example embodiments may have a structure similar to that of the photodiode 100 shown in FIG. 1. In detail, the photodiode 200 may include an anode 220, a cathode 230, a photoelectric conversion layer 210 disposed between the anode 220 and the cathode 230, and a buffer layer 240 disposed between the anode 220 and the photoelectric conversion layer 210. However, different from the photodiode 100 shown in FIG. 1, the buffer layer 240 has a dual-layered structure including an organic layer 242 and an inorganic layer 244.

The organic layer 242 may include an organic material, for example, at least one of 2TNATA, m-MTDATA, and MeO-TPD. The inorganic layer 244 may include an inorganic material, for example, at least one of MoOx, VxOy, WOx, ReOx, RexOy, and CuI. The 'x' or 'y' of MoOx, VxOy, WOx, ReOx, and RexOy is determined based on the atoms' normal valence. Each of the organic layer 242 and the inorganic layer 244 may have a thickness of about 1 nm to about 100 nm.

Materials and forming methods of layers except for the buffer layer 240 may be substantially the same as those of corresponding layers shown in FIG. 1.

In the photodiode 200, the organic layer 242 of the buffer layer 240, which has a low LUMO (lowest unoccupied molecular orbital) energy level, may control the dark current. In addition, the inorganic layer 244 of which a HOMO (highest occupied molecular orbital) energy level lies between HOMO energy levels of the organic layer 242 and the photoelectric conversion layer 210 may serve as a buffer for the difference in the HOMO energy level between the organic layer 242 and the photoelectric conversion layer 210, thereby improving the external quantum efficiency. Furthermore, because the inorganic material has relatively high thermal stability as compared with the organic material, the reliability of the photodiode 200 may be improved even in higher temperatures.

Figure 3:
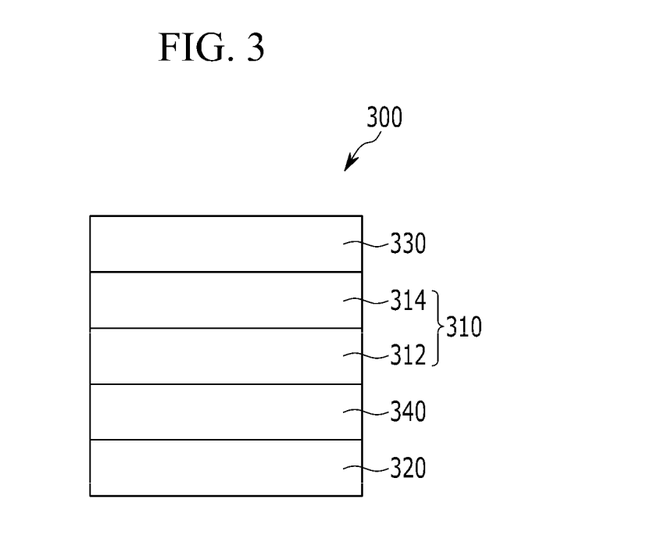
Figure 4:
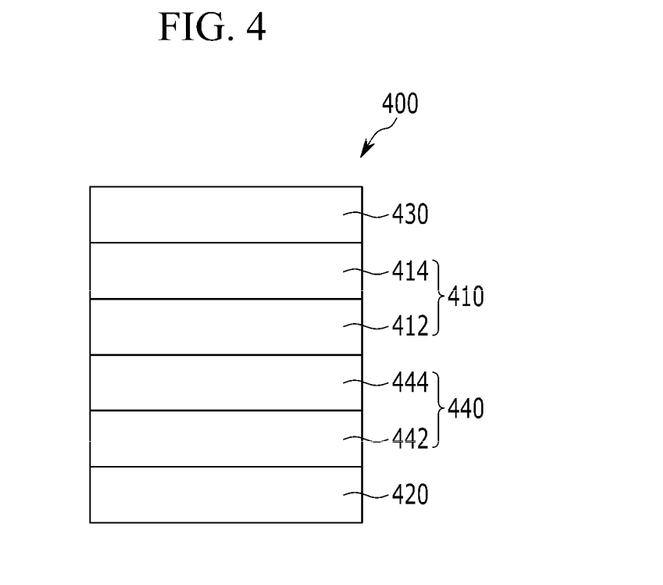

FIGS. 3 and 4 are schematic sectional views of photodiodes according to example embodiments. Referring to FIG. 3, a photodiode 300 according to example embodiments may include a photoelectric conversion layer 310, an anode 320 and a cathode 330 disposed on opposing sides of the photoelectric conversion layer 310, and a buffer layer 340 disposed between the photoelectric conversion layer 310 and the anode 320.

The anode 320, the cathode 330, and the buffer layer 340 may be substantially the same as the anode 120, the cathode 130, and the buffer layer 140 shown in FIG. 1, respectively.

The photoelectric conversion layer 310 may include a lower layer 312 disposed on the buffer layer 340 and an upper layer 314 disposed on the lower layer 312.

According to example embodiments, the lower layer 312 may be a P-type layer, and the upper layer 314 may be an intrinsic layer. In detail, the lower layer 312 may include a P-type semiconductor but substantially not an N-type semiconductor, and the upper layer 314 may be formed by co-depositing a P-type semiconductor and an N-type semiconductor.

According to example embodiments, the lower layer 312 may be an intrinsic layer, and the upper layer 314 may be an N-type layer. In detail, the lower layer 312 may be formed by co-depositing a P-type semiconductor and an N-type semiconductor, and the upper layer 314 may include an N-type semiconductor but substantially not a P-type semiconductor.

The P-type semiconductor may include, for example, at least one of NNQA, diindenoperylene, and dibenzo{[f,f']-4,4',7,7'-tetraphenyl}diindeno[1,2,3-cd:1',2',3'-lm]perylene, and the N-type semiconductor may include, for example, at least one of DCV3T, C60, and perylene diimide. However, other semiconductors also may be used for the P-type semiconductor and the N-type semiconductor.

The lower layer 312 and the upper layer 314 may include the same P-type semiconductor material or the same N-type semiconductor material.

Referring to FIG. 4, a photodiode 400 according to example embodiments may include a photoelectric conversion layer 410, an anode 420 and a cathode 430 disposed on opposing sides of the photoelectric conversion layer 410, and a buffer layer 440 disposed between the photoelectric conversion layer 410 and the anode 420.

The anode 420, the cathode 430, and the buffer layer 440 may be substantially the same as the anode 220, the cathode 230, and the buffer layer 240 shown in FIG. 2, respectively. The buffer layer 440 may include an organic layer 442 and an inorganic layer 444 substantially the same as the organic layer 242 and the inorganic layer 244 of the buffer layer 240 shown in FIG. 2. The photoelectric conversion layer 410 may include a lower layer 412 and an upper layer 414 substantially the same as the lower layer 312 and the upper layer 314 of the photoelectric conversion layer 310 shown in FIG. 3.

Figure 5:
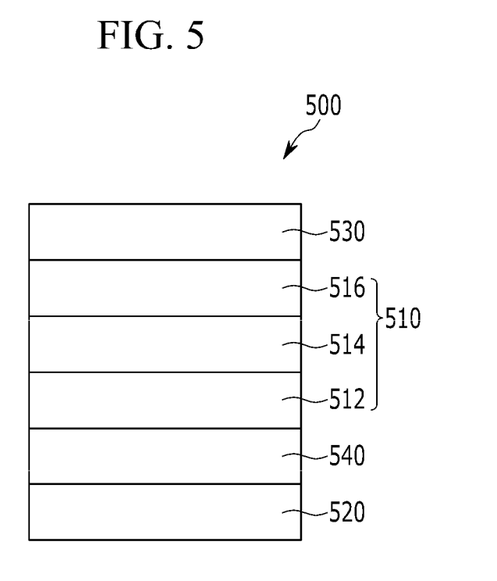
Figure 6:
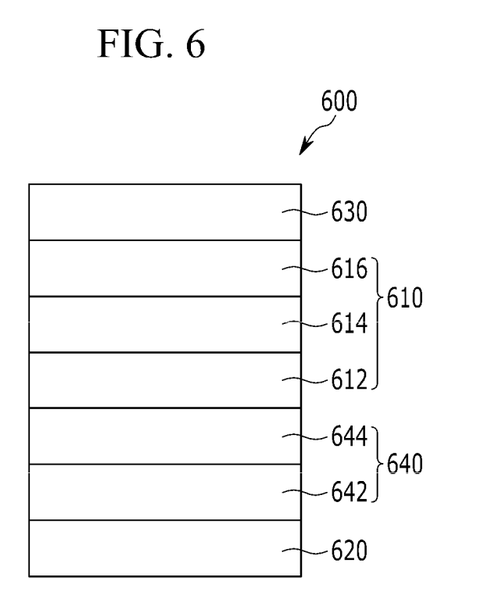

FIGS. 5 and 6 are schematic sectional views of photodiodes according to example embodiments. Referring to FIG. 5, a photodiode 500 according to example embodiments may include a photoelectric conversion layer 510, an anode 520 and a cathode 530 disposed on opposing sides of the photoelectric conversion layer 510, and a buffer layer 540 disposed between the photoelectric conversion layer 510 and the anode 520.

The anode 520, the cathode 530, and the buffer layer 540 may be substantially the same as the anode 120, the cathode 130, and the buffer layer 140 shown in FIG. 1, respectively.

The photoelectric conversion layer 510 may include a lower layer 512, an intermediate layer 514, and an upper layer 516 sequentially deposited on the buffer layer 540.

The lower layer 512 may be a P-type layer that includes a P-type semiconductor but substantially not an N-type semiconductor, the intermediate layer 514 may be an intrinsic layer that includes both a P-type semiconductor and an N-type semiconductor, and the upper layer 516 may be an N-type layer that includes an N-type semiconductor but substantially not a P-type semiconductor.

The P-type semiconductor may include, for example, at least one of NNQA, diindenoperylene, and dibenzo{[f,f']-4,4',7,7'-tetraphenyl}diindeno[1,2,3-cd:1',2',3'-lm]perylene, and the N-type semiconductor may include, for example, at least one of DCV3T, C60, and perylene diimide. However, other semiconductors also may be used for the P-type semiconductor and the N-type semiconductor.

The lower layer 512 and the intermediate layer 514 may include the same P-type semiconductor material and the intermediate layer 514 and the upper layer 516 may include the same N-type semiconductor material.

Referring to FIG. 6, a photodiode 600 according to example embodiments may include a photoelectric conversion layer 610, an anode 620 and a cathode 630 disposed on opposing sides of the photoelectric conversion layer 610, and a buffer layer 640 disposed between the photoelectric conversion layer 610 and the anode 620.

The anode 620, the cathode 630, and the buffer layer 640 may be substantially the same as the anode 220, the cathode 230, and the buffer layer 240 shown in FIG. 2, respectively. The buffer layer 640 may include an organic layer 642 and an inorganic layer 644 substantially the same as the organic layer 242 and the inorganic layer 244 of the buffer layer 240 shown in FIG. 2. The photoelectric conversion layer 610 may include a lower layer 612, an intermediate layer 614, and an upper layer 616 may be substantially the same as the lower layer 512, the intermediate layer 514, and the upper layer 516 of the photoelectric conversion layer 510 shown in FIG. 5.

Figure 7:
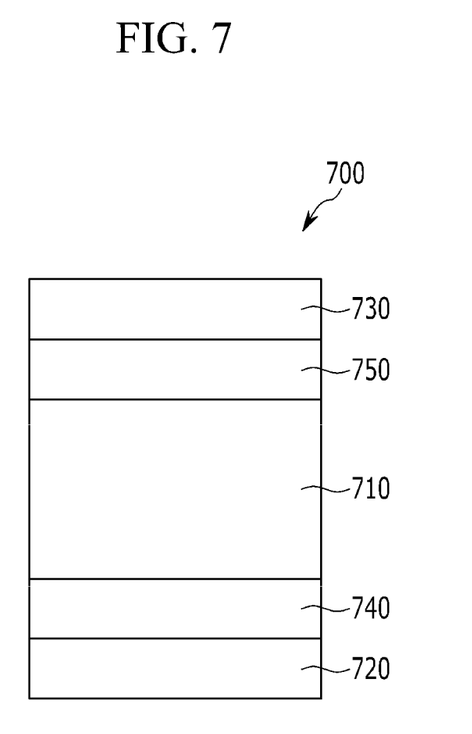
Figure 8:
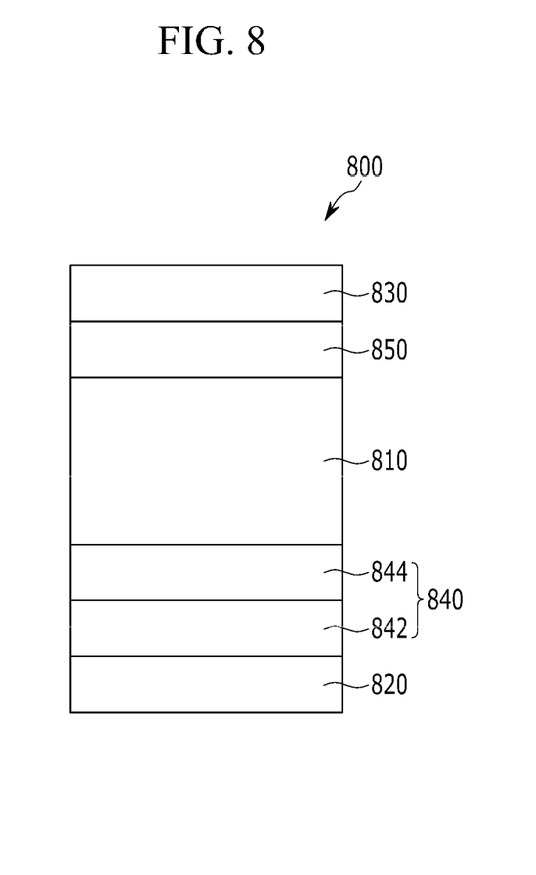

FIGS. 7 and 8 are schematic sectional views of photodiodes according to example embodiments. Referring to FIG. 7, a photodiode 700 according to example embodiments may include a photoelectric conversion layer 710, an anode 720 and a cathode 730 disposed on opposing sides of the photoelectric conversion layer 710, a buffer layer 740 disposed between the photoelectric conversion layer 710 and the anode 720, and a hole blocking layer 750 disposed between the photoelectric conversion layer 710 and the cathode 730.

The photoelectric conversion layer 710, the anode 720, the cathode 730, and the buffer layer 740 may be substantially the same as the photoelectric conversion layer 110, the anode 120, the cathode 130, and the buffer layer 140 shown in FIG. 1, respectively.

The hole blocking layer 750 (that may also be referred to as an electron transport layer) may block holes from moving from the cathode 730 to the photoelectric conversion layer 710, thereby promoting the light absorption in the photoelectric conversion layer 710 to produce more excitons. The hole blocking layer 750 may include, for example, at least one of 4,7-diphenyl-1,10-phenanthroline ("Bphen"), 2,9-dimethyl-4,7-diphenyl-1,10-phenanthroline ("BCP"), 2,2',2''-(1,3,5-benzinetriyl)-tris(1-phenyl-1-Hbenzimidazole) ("TPBi"), 1,3-bis[2-(2,2'-bipyridine-6-yl)-1,3,4-oxadiazo-5-yl]benzene ("Bpy-OXD"), 2,7-bis[2-(2,2'-bipyridine-6-yl)-1,3,4-oxadiazo-5-yl]-9,9-dimethylfluorene ("Bpy-FOXD"), bis-4,6-(3,5-di-3-pyridylphenyl)-2-methylpyrimidine ("B3PYMPM"), Tris(2,4,6-trimethyl-3-(pyridin-3-yl)phenyl)borane ("3TPYMB"), 3,3',5,5'-tetra[(m-pyridyl)-phen-3-yl]biphenyl ("BP4MPY"), and 1,3-bis[3,5-di(pyridin-3-yl)phenyl]benzene ("BmPyPhB"). The photoelectric conversion layer 710 may have a structure as shown in FIG. 3 or FIG. 5.

Referring to FIG. 8, a photodiode 800 according to example embodiments may include a photoelectric conversion layer 810, an anode 820 and a cathode 830 disposed on opposing sides of the photoelectric conversion layer 810, a buffer layer 840 disposed between the photoelectric conversion layer 810 and the anode 820, and a hole blocking layer 850 disposed between the photoelectric conversion layer 810 and the cathode 830.

The photoelectric conversion layer 810, the anode 820, the cathode 830, and the buffer layer 840 may be substantially the same as the photoelectric conversion layer 210, the anode 220, the cathode 230, and the buffer layer 240 shown in FIG. 2, respectively. The buffer layer 840 may include an organic layer 842 and an inorganic layer 844 substantially the same as the organic layer 242 and the inorganic layer 244 of the buffer layer 240 shown in FIG. 2. The hole blocking layer 850 may be substantially the same as the hole blocking layer 750 shown in FIG. 7.

Referring to FIGS. 9 to 14, photodiodes according to example embodiments and comparative photodiodes are described in detail.

Figure 9:
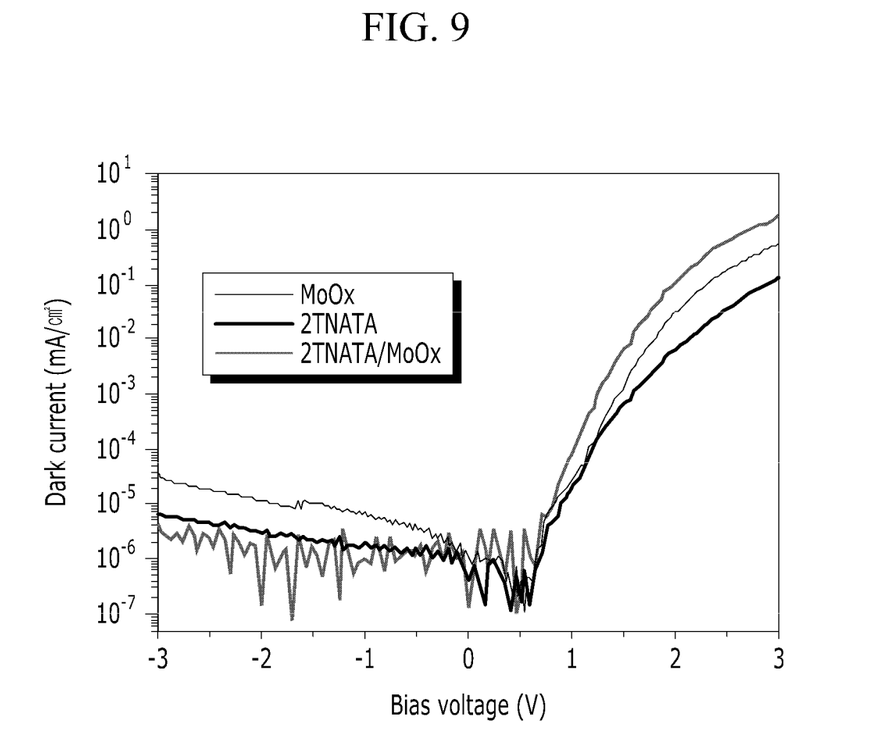
FIG. 9 is a graph showing dark currents of photodiodes in accordance with example embodiments and comparative photodiodes under room temperature as a function of a bias voltage.
Figure 10:
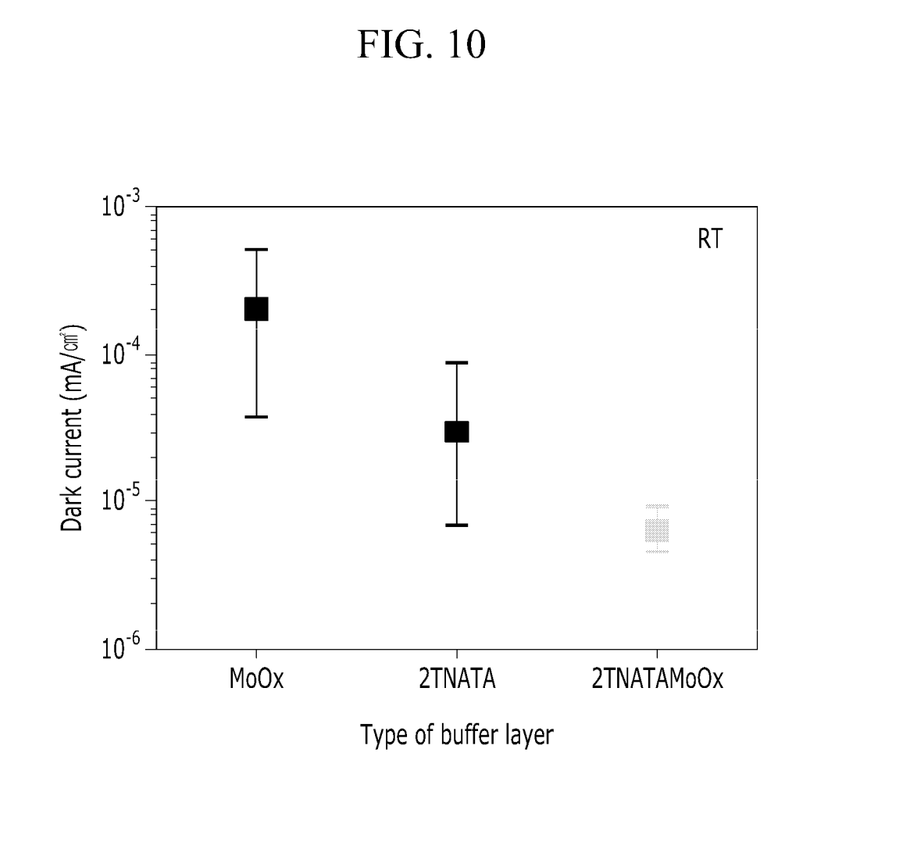
FIG. 10 is a graph showing dark current with a bias voltage of about −3 V under room temperature −3V for different types of a buffer layer.
Figure 11:
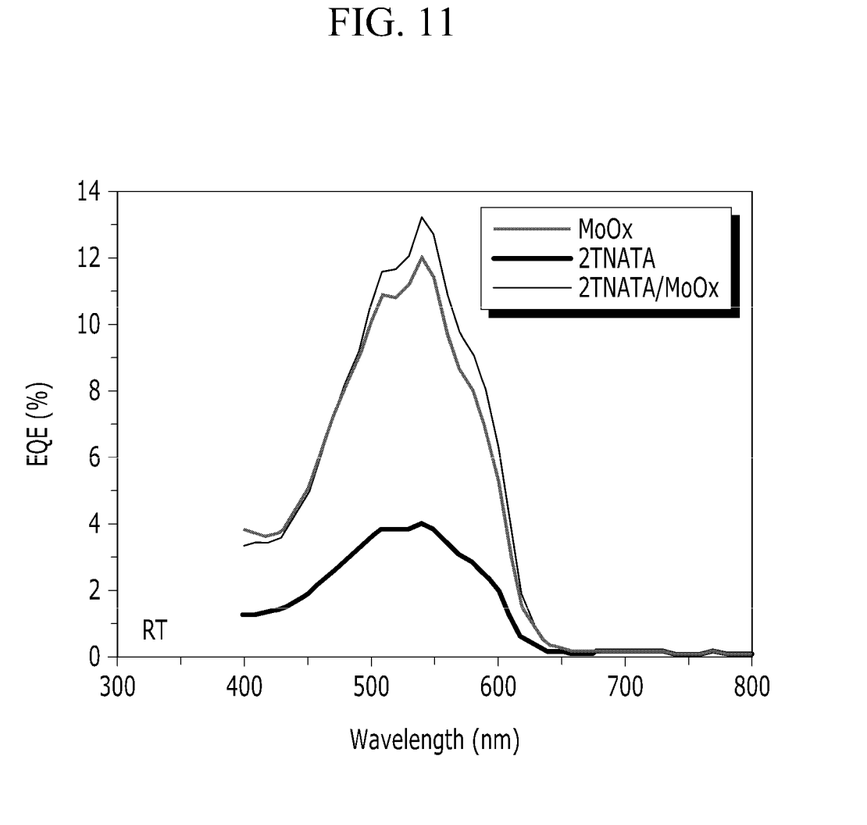
FIG. 11 is a graph showing external quantum efficiency ("EQE") of photodiodes in accordance with example embodiments and comparative photodiodes under room temperature as a function of wavelength of incident light.
Figure 12:
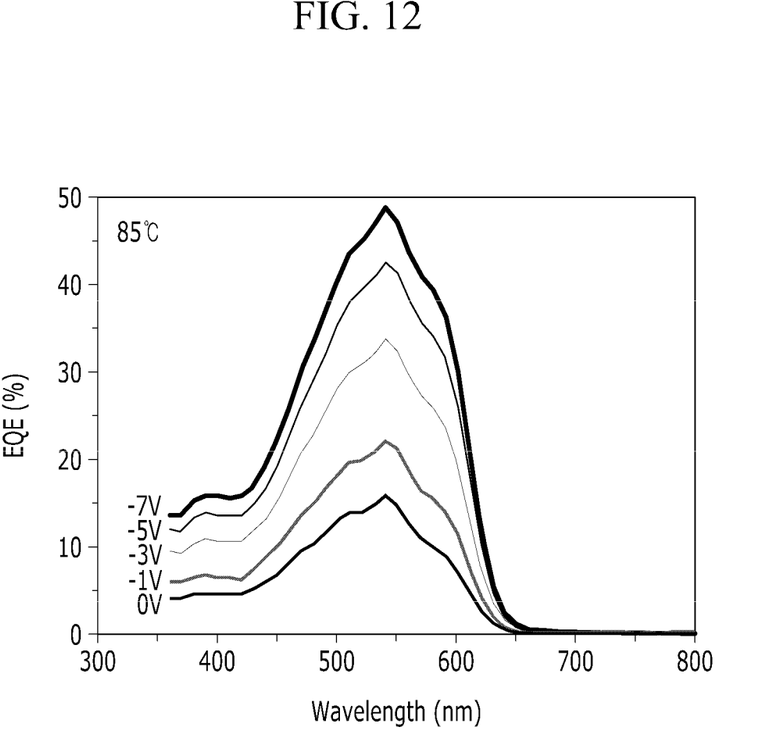
FIG. 12 is a graph showing EQE of an Example Diode 2 in accordance with a photodiode of example embodiments under about 85° C. as a function of wavelength of incident light for various bias voltages.
Figure 13:
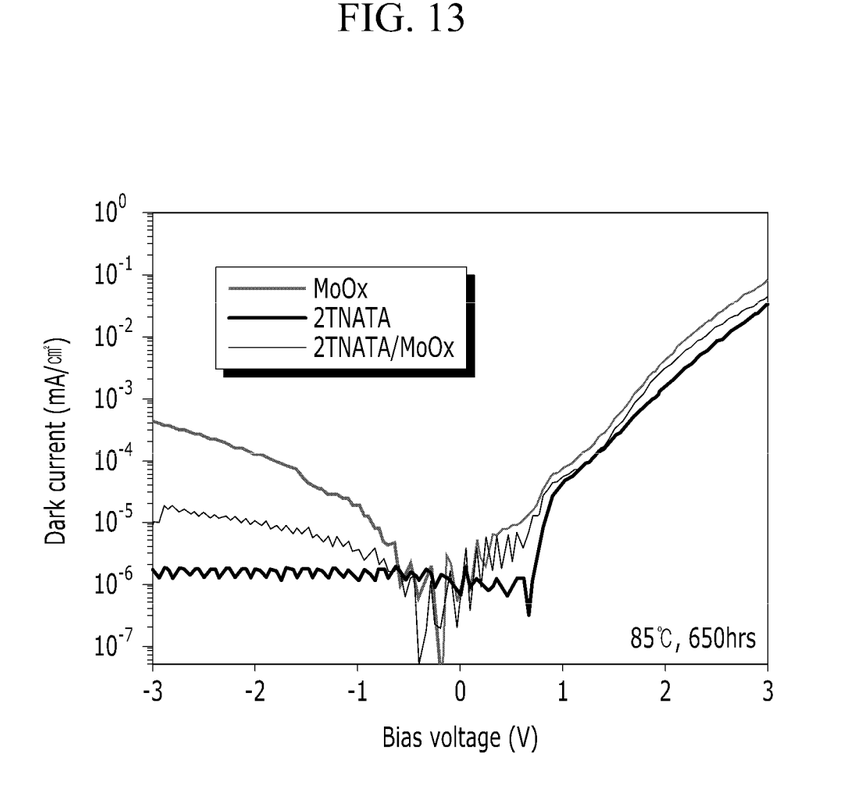
FIG. 13 is a graph showing dark current of photodiodes in accordance with example embodiments and comparative photodiodes stored under about 85° C. for about 650 hours as a function of bias voltage.
Figure 14:
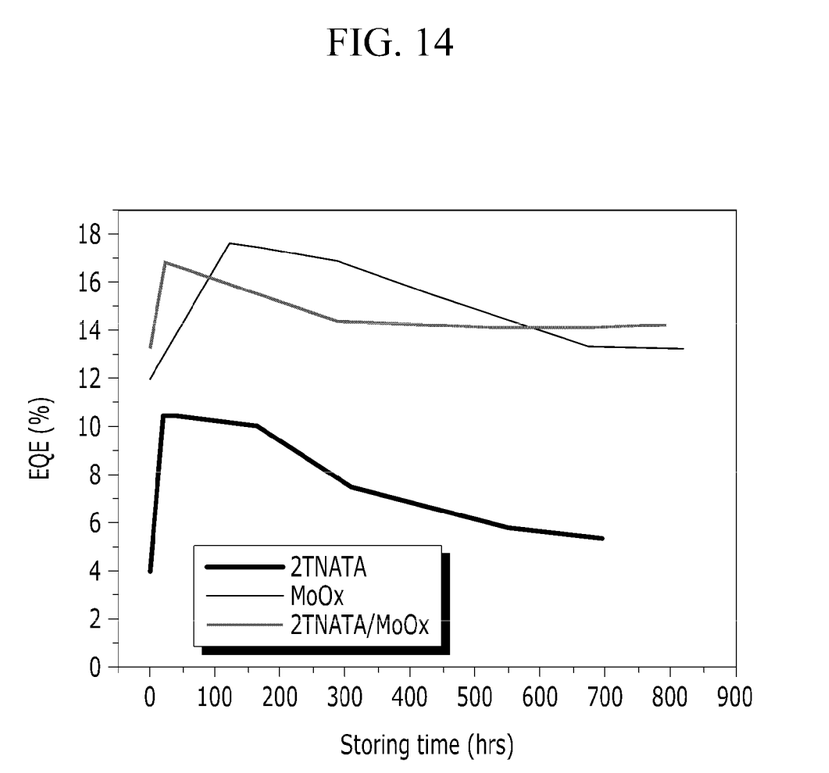
FIG. 14 is a graph showing EQE of photodiodes in accordance with example embodiments and comparative photodiodes under about 85° C. as a function of storing time.

FIG. 9 is a graph showing dark currents of photodiodes in accordance with example embodiments and comparative photodiodes under room temperature as a function of a bias voltage, FIG. 10 is a graph shown dark current with a bias voltage of about −3 V under room temperature −3V for different types of a buffer layer, FIG. 11 is a graph showing external quantum efficiency ("EQE") of photodiodes in accordance with example embodiments and comparative photodiodes under room temperature as a function of wavelength of incident light, FIG. 12 is a graph showing EQE of Example Diode 2 according to a photodiode of example embodiments under about 85° C. as a function of wavelength of incident light for various bias voltages, FIG. 13 is a graph showing dark current of photodiodes in accordance with example embodiments and comparative photodiodes stored under about 85° C. for about 650 hours as a function of bias voltage, and FIG. 14 is a graph showing EQE of photodiodes in accordance with example embodiments and comparative photodiodes under about 85° C. as a function of storing time.

A photodiode 500 having a structure shown in FIG. 5 (referred to as Example Diode 1 hereinafter), a photodiode 600 having a structure shown in FIG. 6 (referred to as Example Diode 2 hereinafter), and a photodiode having a structure shown in FIG. 5 except that a material for a buffer layer is MoOx (referred to as comparative diode hereinafter) were manufactured.

A lower layer 512 or 612 of a photoelectric conversion layer 510 or 610 was formed of DCV3T, an upper layer 516 or 616 thereof was formed of NNQA, and an intermediate layer 514 or 614 was formed by co-deposition of DCV3T and NNQA.

An anode 520 or 620 was formed of ITO, and a cathode 530 or 630 was formed of Al. A buffer layer 510 for the Example Diode 1 was formed of 2TNATA, and an organic layer 642 and an inorganic layer 644 of a buffer layer 620 for the Example Diode 2 were formed of 2TNATA and MoOx, respectively.

For the three kinds of photodiodes manufactured as described above, dark current was measured by varying the magnitude of a bias voltage under a room temperature. Referring to FIG. 9, the dark current for the Example Diodes 1 and 2 was smaller than that for the comparative diode under reverse bias, that is, when the bias voltage was smaller than zero. Referring to FIG. 10, the dark current for the Example Diode 2 was smaller than that for the Example Diode 1 which in turn was smaller than that of the comparative diode when the bias voltage was about −3 V.

Referring to FIG. 11, the external quantum efficiency ("EQE") for the three kinds of the photodiodes was measured under room temperature as a function of wavelength, and the Example Diode 2 had a slightly higher value than the comparative diode while the Example Diode 1 had a lower value than the comparative diode and the Example Diode 2.

Referring to FIG. 12, EQE of the Example Diode 2 was measured under about 85° C. for a bias voltage of about 0 V, about −1 V, about −3 V, about −5 V, and about −7 V, and EQE increased as the magnitude of the reverse bias increased.

Referring to FIG. 13, after the Example Diodes 1 and 2 and the comparative diode were stored under about 85° C. for about 650 hours, the dark current was measured by varying the bias voltage. Under the reverse bias, the Example Diodes 1 and 2 had lower dark current than the comparative diode.

Referring to FIG. 14, while the Example Diodes 1 and 2 and the comparative diode were stored under about 85° C., EQE for the three diodes was measured periodically. As a result, the comparative diode showed dominantly decreasing EQE as the storing time increased, and the Example Diodes 1 and 2 showed relatively small change in EQE even if the storing time increased.

As described above, the photodiodes according to example embodiments may have smaller dark current and higher EQE. In particular, the photodiodes may have a desirable EQE even under relatively high (or alternatively, extreme) temperatures.

While this disclosure has been described in connection with what is presently considered to be practical example embodiments, it is to be understood that inventive concepts are not limited to the disclosed embodiments, but, on the contrary, is intended to cover various modifications and equivalent arrangements included within the spirit and scope of the appended claims.

What is claimed is:

1. A photodiode comprising:
an anode;
a cathode;
a photoelectric conversion layer between the anode and the cathode; and
a buffer layer between the photoelectric conversion layer and the anode, the buffer layer having a dual-layered structure including an organic layer and an inorganic layer,
wherein the organic layer is located closer to the anode than the inorganic layer, and
wherein the organic layer contacts the anode.

2. The photodiode of claim 1, wherein the organic layer includes at least one of 4,4',4"-tris(N-(2-naphthyl)-N-phenyl-amino)-triphenylamine ("2TNATA"), 4,4',4"-tris(N-3-methylphenyl-N-phenylamino)triphenylamine ("m-MTDATA"), and N, N,N',N'-tetrakis(4-methoxyphenyl)-benzidine ("MeO-TPD").

3. The photodiode of claim 1, wherein the inorganic layer includes at least one of molybdenum oxide, vanadium oxide, tungsten oxide, rhenium oxide and copper iodide.

4. The photodiode of claim 1, wherein the organic layer includes 2TNATA, and the inorganic layer comprises molybdenum oxide.

5. The photodiode of claim 4, wherein each of the organic layer and the inorganic layer has a thickness of about 1 nm to about 100 nm.

6. The photodiode of claim 1, wherein the photoelectric conversion layer includes an intrinsic layer including a P-type semiconductor and an N-type semiconductor.

7. The photodiode of claim 6, wherein the photoelectric conversion layer further comprises:
a P-type layer between the intrinsic layer and the buffer layer, the P-type layer including a P-type semiconductor but substantially not an N-type semiconductor, and
the P-type semiconductor includes at least one of N,N'-dimethyl-quinacridone ("NNQA"), diindenoperylene, and dibenzo{[f,f']-4,4',7,7'-tetraphenyl}diindeno[1,2,3-cd: 1',2',3'-lm]perylene.

8. The photodiode of claim 7, wherein the photoelectric conversion layer further comprises:
an N-type layer between the intrinsic layer and the cathode, the N-type layer including an N-type semiconductor but substantially not a P-type semiconductor, and
the N-type semiconductor includes at least one of dicyanovinyl-terthiophene ("DCV3T"), C60, and perylene diimide.

9. The photodiode of claim 7, wherein the photoelectric conversion layer further comprises:
an N-type layer between the intrinsic layer and the cathode, the N-type layer including an N-type semiconductor but substantially not a P-type semiconductor,
the P-type semiconductor includes at least one of N,N'-dimethyl-quinacridone ("NNQA"), diindenoperylene, and dibenzo{[f,f']-4,4',7,7'-tetraphenyl}diindeno[1,2,3-cd: 1',2',3'-lm]perylene,and
the N-type semiconductor includes at least one of dicyanovinyl-terthiophene ("DCV3T"), C60, and perylene diimide.

10. The photodiode of claim 1, further comprising:
a hole blocking layer between the photoelectric conversion layer and the cathode.

11. The photodiode of claim 10, wherein the hole blocking layer includes at least one of 4,7-diphenyl-1,10-phenanthroline ("Bphen"), 2,9-dimethyl-4,7-diphenyl-1, 10-phenanthroline ("BCP"), 2,2',2"-(1,3,5-benzinetriyl)-tris(1-phenyl-1-Hbenzimidazole) ("TPBi"), 1,3-bis[2-(2,2'-bipyridine-6-yl)-1,3,4-oxadiazo-5-yl]benzene ("Bpy-OXD"), 2,7-bis[2-(2,2'-bipyridine-6-yl)-1,3,4-oxadiazo-5-yl]-9,9-dimethylfluorene ("Bpy-FOXD"), bis-4,6-(3,5-di-3-pyridylphenyl)-2-methylpyrimidine (B3PYMPM), Tris(2,4,6-trimethyl-3-(pyridin-3-yl)phenyl)borane ("3TPYMB"), 3,3',5,5'-tetra[(m-pyridyl)-phen-3-yl]biphenyl ("BP4MPY"), and 1,3-bis[3,5-di(pyridin-3-yl)phenyl]benzene (BmPyPhB).

* * * * *